United States Patent
Abdelmoneum et al.

(10) Patent No.: US 10,020,931 B2
(45) Date of Patent: Jul. 10, 2018

(54) APPARATUS FOR DYNAMICALLY ADAPTING A CLOCK GENERATOR WITH RESPECT TO CHANGES IN POWER SUPPLY

(71) Applicant: Intel Corporation, Santa Clara, CA (US)

(72) Inventors: Mohamed A. Abdelmoneum, Portland, OR (US); Nasser A. Kurd, Portland, OR (US); Amr M. Lotfy, Alexandria (EG); Mamdouh O. Abd El-Mejeed, Alexandria (EG); Mohamed A. Abdelsalam, Giza (EG)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/789,241

(22) Filed: Mar. 7, 2013

(65) Prior Publication Data
US 2014/0254734 A1    Sep. 11, 2014

(51) Int. Cl.
*H03D 3/24* (2006.01)
*H04L 7/033* (2006.01)
*H03L 7/099* (2006.01)

(52) U.S. Cl.
CPC .......... *H04L 7/0331* (2013.01); *H03L 7/0995* (2013.01); *H04L 7/033* (2013.01)

(58) Field of Classification Search
CPC ...... C12N 15/85; C07K 14/47; C07K 14/705; H03L 7/08
See application file for complete search history.

(56) References Cited

U.S. PATENT DOCUMENTS

| | | | |
|---|---|---|---|
| 5,304,952 A * | 4/1994 | Quiet et al. | 331/1 A |
| 7,330,081 B1 | 2/2008 | Asa et al. | |
| 9,628,089 B1 * | 4/2017 | Jain | H03L 7/0802 |
| 2003/0112038 A1 * | 6/2003 | Naffziger et al. | 327/100 |
| 2004/0119521 A1 * | 6/2004 | Kurd et al. | 327/291 |

(Continued)

FOREIGN PATENT DOCUMENTS

| | | |
|---|---|---|
| CN | 101842986 | 9/2010 |
| EP | 1107457 A2 | 6/2001 |

(Continued)

OTHER PUBLICATIONS

Decision to Refuse for Japanese Patent Application No. 2014-042742 dated Jan. 26, 2016, 7 pages.

(Continued)

*Primary Examiner* — Shuwang Liu
*Assistant Examiner* — Gina McKie
(74) *Attorney, Agent, or Firm* — Green, Howard & Mughal LLP (57) ABSTRACT

Described is an integrated circuit (IC) with apparatus for dynamically adapting a clock generator, e.g., phase locked loop (PLL), with respect to changes in power supply. The apparatus comprises: a voltage droop detector coupled to power supply node, the voltage droop detector to generate a digital code word representing voltage droop on the power supply node; and a PLL including a ring oscillator coupled to the power supply node, the ring oscillator to generate an output clock signal, the ring oscillator operable to adjust frequency of the output clock signal according to the digital code word.

18 Claims, 9 Drawing Sheets

(56) References Cited

U.S. PATENT DOCUMENTS

| | | | |
|---|---|---|---|
| 2005/0047040 A1* | 3/2005 | Naffziger | 361/90 |
| 2007/0013414 A1* | 1/2007 | Paillet et al. | 327/50 |
| 2007/0152760 A1 | 7/2007 | Tan et al. | |
| 2008/0091755 A1* | 4/2008 | Mudge | G06F 7/588 |
| | | | 708/250 |
| 2010/0214031 A1 | 8/2010 | Yamamoto et al. | |
| 2010/0245142 A1* | 9/2010 | Myles | H03M 1/0665 |
| | | | 341/133 |
| 2012/0126847 A1* | 5/2012 | Kosonocky | G01R 31/40 |
| | | | 324/764.01 |
| 2014/0254734 A1* | 9/2014 | Abdelmoneum | H03L 7/0995 |
| | | | 375/376 |
| 2018/0062627 A1* | 3/2018 | Weng | H03K 5/1252 |

FOREIGN PATENT DOCUMENTS

| | | |
|---|---|---|
| JP | 63214969 | 7/1988 |
| JP | S63-214969 A | 9/1988 |
| JP | 11186880 | 9/1999 |
| JP | 2001077673 | 3/2001 |
| JP | 2001160752 | 6/2001 |
| JP | 2001160752 A | 6/2001 |
| JP | 2002-171165 A | 6/2002 |
| JP | 2002171165 | 6/2002 |
| JP | 2006-246301 A | 9/2006 |
| JP | 2008-193657 A | 8/2008 |
| WO | 2009057289 | 5/2009 |
| WO | 2009-057289 A1 | 7/2009 |

OTHER PUBLICATIONS

Office Action for German Patent Application No. 10-2014-002-283.8 dated Mar. 7, 2016, 11 pages.

English Translation of Notice of Reasons for Rejection from Japan Patent Office for Japanese Patent Application No. 2014-042742, dated Jul. 21, 2015, 4 pages.

Office Action from Japan Patent Application No. 2014042742, dated Feb. 21, 2017.

First Office Action, dated Aug. 25, 2016, for CN Patent Application No. 201410079920.7.

Notice of Allowance for Japan Patent Application No. 2014-042742, dated Jul. 18, 2017.

Second Office Action for Chinese Patent Application No. 201410079920.7, dated May 22, 2017.

Third Office Action, dated Feb. 7, 2018, for CN Patent Application No. 201410079920.7.

* cited by examiner

APPARATUS FOR DYNAMICALLY ADAPTING A CLOCK GENERATOR WITH RESPECT TO CHANGES IN POWER SUPPLY

BACKGROUND

Clock signal may be generated by a phase locked loop (PLL). A clock signal may be distributed throughout a processor to facilitate the processor's operation. For example, state elements (e.g., Flip-flops, latches, etc.) located at different points in the processor die may function synchronously by operating in accordance with the clock signal. When a large, sudden current requirement occurs, the on-die voltage supply provided to the state elements may "droop" (e.g., for a few nanoseconds) while the PLL continues to generate a clock signal with a fixed frequency. Note that other voltage droop events may last even longer. To ensure that the processor functions during these droop events, a high voltage margin may be provided for the state elements even during normal operation (e.g., when there is no voltage droop). That is, the processor is designed to operate at both the highest specified frequency and at the lowest potential voltage simultaneously.

Since power has a quadratic dependence on voltage, a significant amount of power may be wasted during normal operation to ensure functionality during the infrequent voltage droops. Moreover, as processor speed and integration increases, the amount of power that is required may become a limiting factor. For example, the costs of designing and cooling a processor that consumes a significant amount of power may become impractical.

Existing analog PLLs implement Adaptive Frequency Scaling (AFS) to compensate for power supply voltage droops and overshoots. One such AFS technique is described by U.S. Pat. No. 6,922,111. Current analog implementation of AFS technique directly modulates the VCO supply through resistive coupling of the digital power supply. The current analog implementation does not fully exploit the full benefits of the AFS technique at lower voltages and lower frequencies.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

The embodiments describe an apparatus that allows for adaptive frequency scaling of a clock generator (e.g., PLL) using a droop detector. In one embodiment, the output of the droop detector is a digital signal that can be used for adaptive frequency scaling of clock signals generated by analog and/or digital PLLs. In one embodiment, the output of the droop detector is a digital code word with a length proportional to droop quantization. In one embodiment, the digital code word is a thermometer code.

In one embodiment, the thermometer code is applied to an oscillator of the PLL to adjust delay characteristics of the oscillator elements (also called delay elements) which allows for a faster frequency adjustment at the output of the oscillator. In one embodiment, the thermometer code is also applied to a charge-pump of the PLL to adjust PLL loop characteristics so that the PLL recovers from the voltage droop or overshoot as quickly as possible. In one embodiment, the thermometer code is received by a programmable filter (e.g., as in the case of a digital PLL) to adjust filter coefficients in effect adjusting the PLL loop dynamics characteristics thus responding to the accumulated phase error in a dynamic manner. In one embodiment the thermometer code is received by a programmable charge pump (e.g., as in the case of the analog PLL) to adjust the charge pump current strength in effect adjusting the PLL loop dynamics characteristics thus responding to the accumulated phase error in a dynamic manner.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a", "an", and the include plural references. The meaning of "in" includes "in" and "on."

The term "scaling" generally refers to converting a design (schematic and layout) from one process technology to another process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFet transistors, Gate All Around Cylindrical Transistors or other devices implementing transistor functionality like carbon nano tubes or spintronic devices. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

Figure 1:
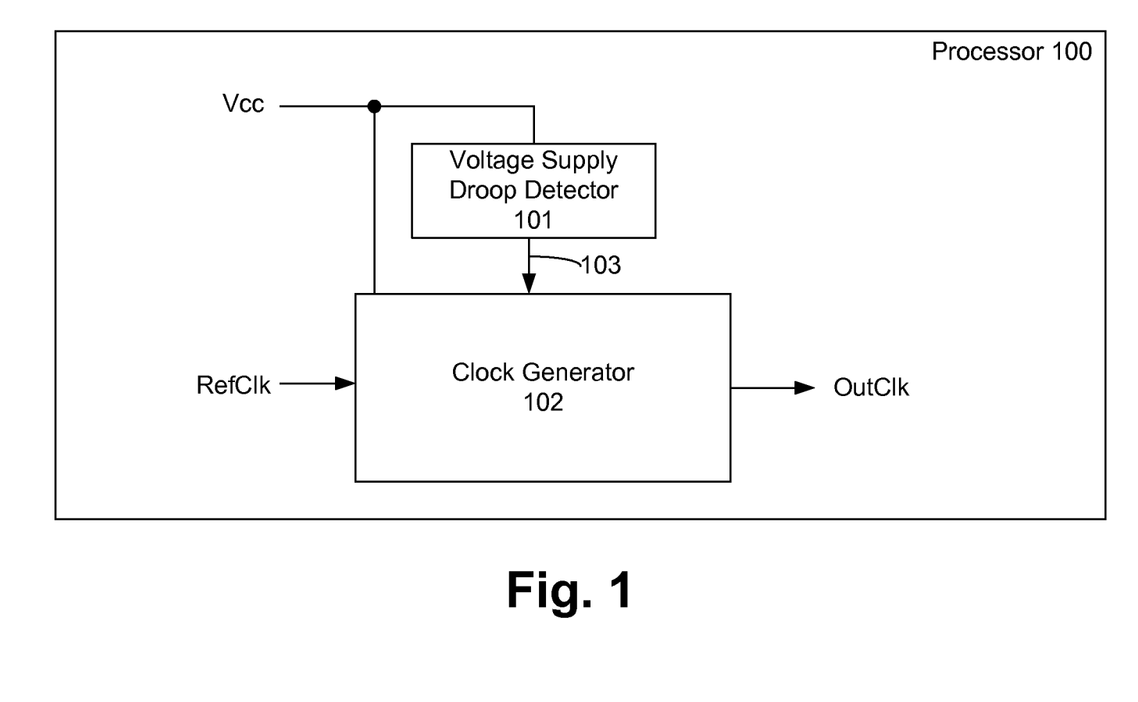
FIG. 1 is a high level architecture of a processor having a droop detector for a clock generator, according to one embodiment of the disclosure.

FIG. 1 is a high level architecture of a processor 100 having a droop detector for a clock generator, according to one embodiment of the disclosure. In one embodiment, the high level architecture comprises a voltage supply droop detector 101 and a clock generator 102. In one embodiment, voltage supply droop detector 101 receives power supply (Vcc), which is also supplied to clock generator 102, and generates a digital code word 103 which represents Vcc (i.e., power supply on power supply node). In one embodiment, digital code word 103 is a thermometer code word which is a monotonic representation of any droop or overshoots on Vcc. In one embodiment, the response time (i.e., time taken by the voltage supply droop detector 101 to generate digital code word 103) of voltage supply droop detector 101 is short and dictated by the droop detector latency so that clock generator 102 can use the updated digital code 103 to adjust its output clock (OutClk) frequency.

In one embodiment, clock generator 102 receives a reference clock (RefClk) and generates OutClk, which is then provided to state elements (e.g., flip-flops, latches, etc.) and other circuits. In one embodiment, clock generator 102 is a PLL. In one embodiment, clock generator 102 is an analog or mixed signal PLL. For example, clock generator 102 is a self-biased PLL (SBPLL). In one embodiment, clock generator 102 is a digital PLL (DPLL). In one embodiment, the DPLL is an all digital PLL (ADPLL). In one embodiment, clock generator 102 is a delay locked loop (DLL). In one embodiment, clock generator 102 is an LC PLL (i.e., inductor-capacitor based PLL). In other embodiments, clock generator 102 can be any clock generation apparatus which includes a ring oscillator. In one embodiment, clock generator 102 receives digital word 103 which is used by a ring oscillator of clock generator 102.

In one embodiment, when voltage supply droop detector 101 detects a droop on power supply Vcc, voltage supply droop detector 101 generates digital word 103 which represents the droop characteristics in the form of a thermometer code. In such an embodiment, clock generator 102 receives digital word 103 and speeds up or slows down the oscillation frequency of a ring oscillator of clock generator 102 such that OutClk tracks the polarity and magnitude of the droop through the value of the digital word from droop detector 101.

In one embodiment, when droop detector 101 detects an overshoot on power supply Vcc, droop detector 101 generates digital word 103 which represents the overshoot characteristics in the form of a thermometer code. In such an embodiment, clock generator 102 receives digital word 103 and speeds up or slows down the oscillation frequency of the ring oscillator such that OutClk tracks the voltage change. In one embodiment, digital word 103 from droop detector 101 adjusts current of a charge pump when clock generator 102 is an analog PLL (e.g., SBPLL). In such an embodiment, loop dynamics of the analog PLL are changed to respond to the accumulated phase error in a dynamic manner.

Figure 7A:
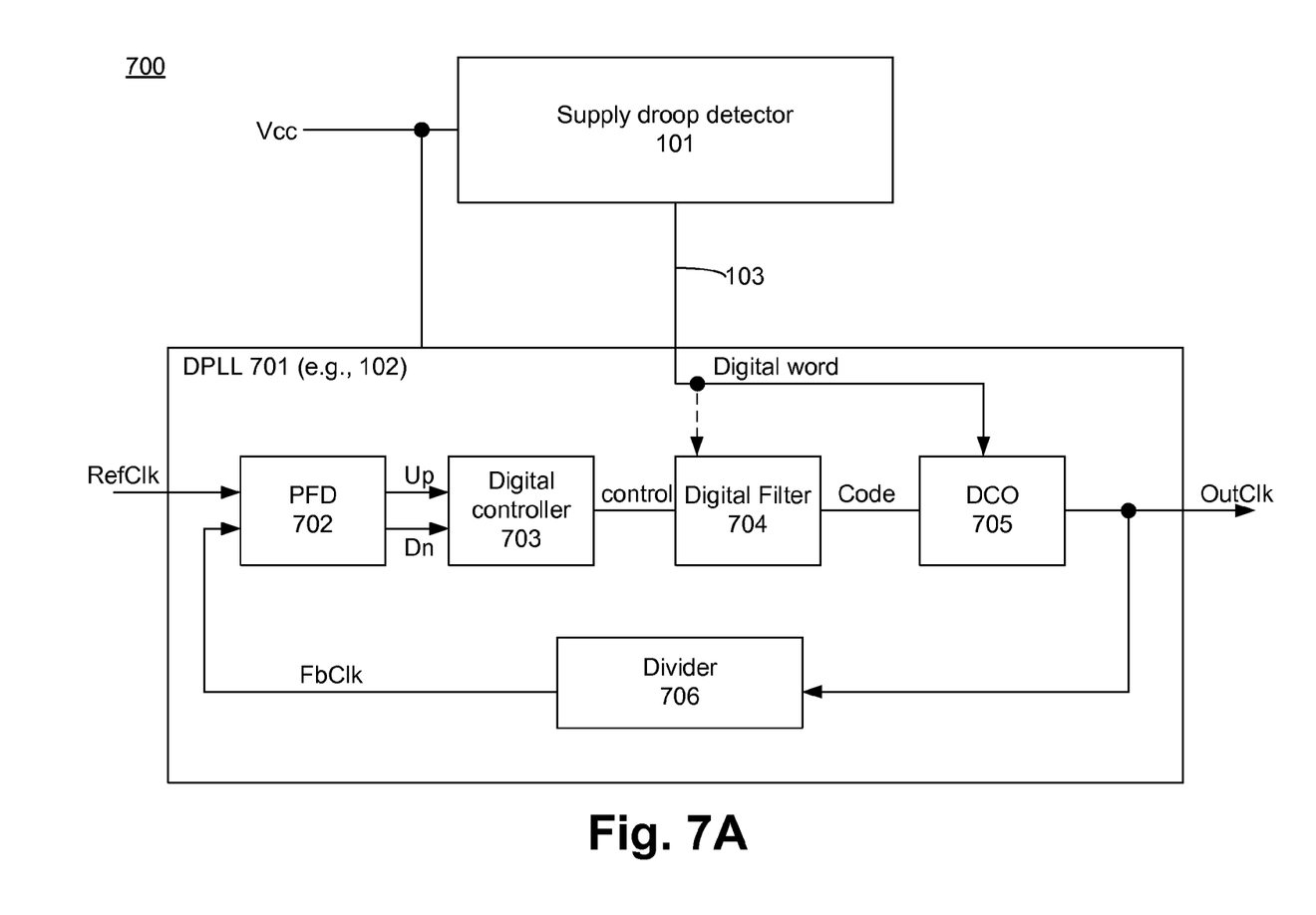
FIG. 7A is a circuit with a droop detector to adaptively scale frequency output of a digital PLL (DPLL) and to dynamically manage the phase error accumulation, caused by change in frequency, according to one embodiment of the disclosure.

In another embodiment, digital word 103 from droop detector 101 adjusts coefficients of a digital filter (e.g., digital filter 704 of FIG. 7) to change loop dynamics to respond to the accumulated phase error in a dynamic manner. In such an embodiment, clock generator 102 is a digital PLL having the digital filter. In one embodiment, after the supply voltage (Vcc) returns to its nominal value, digital word 103 returns to a steady state value. In such an embodiment, oscillator of the clock generator 102 oscillates in normal operation (i.e., no change in its characteristics forced by change in digital word 103). In one embodiment, when oscillator of clock generator 102 oscillates in normal operation, charge pump current (in the case when clock generator 102 is an analog PLL) may assert nominal value. In one embodiment, when oscillator of clock generator 102 oscillates in normal operation, digital loop filter (in the case when clock generator 102 is a digital PLL) may assert nominal coefficients.

Figure 2:
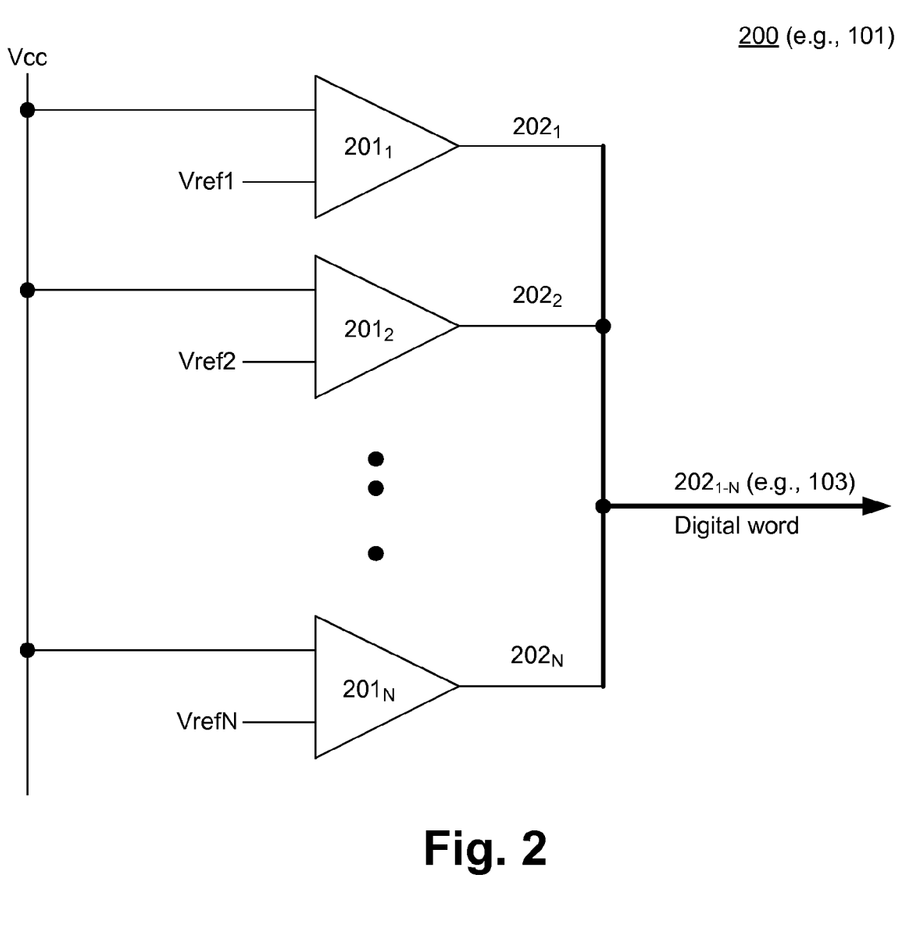
FIG. 2 is a droop detector, according to one embodiment of the disclosure.

FIG. 2 is a droop detector 200, according to one embodiment. It is pointed out that those elements of FIG. 2 having the same reference numbers (or names) as the elements of any other figure can operate or function in any manner similar to that described, but are not limited to such.

In one embodiment, droop detector 200 comprises a plurality of comparators $201_{1-N}$, where 'N' is an integer greater than two. In one embodiment, output of plurality of comparators $201_{1-N}$ is a digital word $202_{1-N}$. In one embodiment, each of the comparators of plurality of comparators $201_{1-N}$ receives power supply Vcc as one of its inputs, and a reference voltage as its other input. For example, comparator $201_1$ compares Vcc and Vref1 and generates an output $202_1$, comparator $201_2$ compares Vcc and Vref2 and generates an output $202_2$, and comparator $201_N$ compares Vcc and VrefN and generates an output $202_N$. In one embodiment, digital word $202_{1-N}$ (e.g., 103) is a thermometer code.

For example, in the absence of a voltage droop, digital word $202_{1-N}$ may output a string of ones and zeros of length N. In this example, when droop detector 200 detects a voltage droop, digital word $202_{1-N}$ begins to introduce a '1' in the digital word $202_{1-N}$. When the droop ends, digital word $202_{1-N}$ may once again generate a string of ones and zeros corresponding to the steady state (no droop) value. The above example can be represented by the following thermometer code $202_{1-N}$: 0000111 (no voltage droop), 0000011 (beginning of voltage droop), 0000011, 0000001, 0000000 (end of voltage droop), and when the voltage starts going again from the bottom of the droop to towards the nominal value the droop detector starts incrementing the digital word from 0000000 to 0000001 and then 0000011 and keeps incrementing till the digital word becomes 0000111 (no voltage droop). For the overshoot case, when the droop detector 200 detects a voltage overshoot, digital word $202_{1-N}$ begins to introduce a '1' in the digital word $202_{1-N}$ and increments it from 0000111, 0001111, 0011111, 0111111, and so on through the droop till 1111111 at the end of the over shot. When the voltage starts going down from the maximum of the overshoot, the digital word will be decremented form 1111111 to 0111111, 0011111 till it becomes 0000111 at the nominal voltage.

In one embodiment, reference voltages Vref1-N are generated by a voltage divider network (not shown). For example, a resistor divider is used to generate Vref1-N. In other embodiments, other types of circuits may be used for generating Vref1-N. For example, bandgap reference circuit may be used to generate a stable reference which is then divided into a number of reference voltages. In one embodiment, droop detector 200 comprises a flash analog-to-digital converter (ADC).

Figure 3:
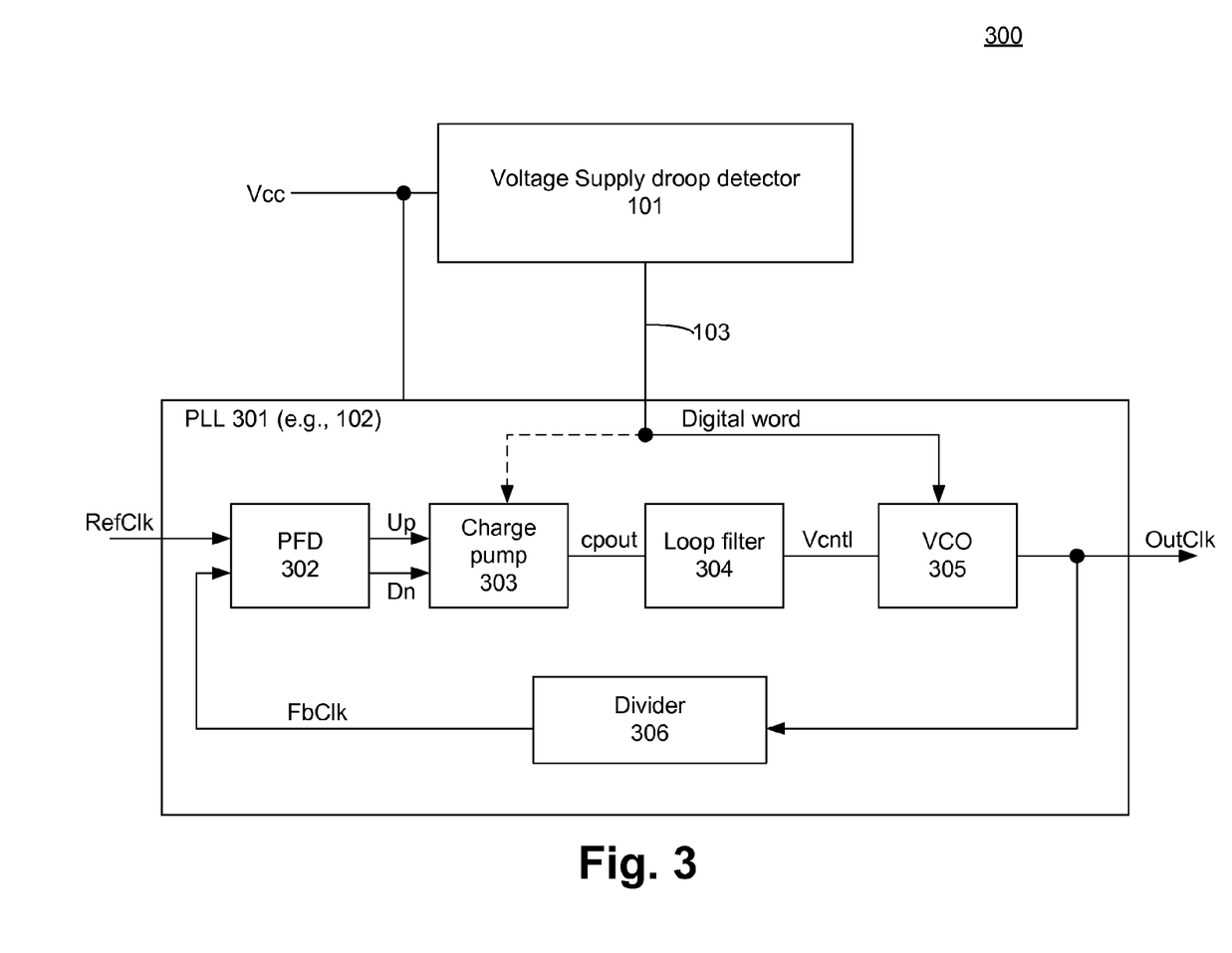
FIG. 3 is a circuit showing a droop detector to adaptively scale frequency output of an analog phase locked loop (PLL) and to dynamically manage the phase error accumulation, caused by change in frequency, according to one embodiment of the disclosure.

FIG. 3 is a circuit 300 showing a droop detector to adaptively scale frequency output of an analog PLL, according to one embodiment of the disclosure. It is pointed out that those elements of FIG. 3 having the same reference numbers (or names) as the elements of any other figure can operate or function in any manner similar to that described, but are not limited to such.

In one embodiment, clock generator 102 is PLL 301 which comprises a phase frequency detector (PFD) 302, charge pump 303, loop filter 304, voltage controlled oscillator (VCO) 305, and divider 306. So as not to obscure the embodiments, all components of PLL 301 are not shown. In one embodiment, PFD 302 receives RefClk and feedback clock (FbClk) from divider 306 and generates Up and Down ("Dn") signals indicating whether FbClk is ahead or behind RefClk in terms of phase and frequency. In one embodiment, Up and Dn signals are received by charge pump 303 that generates an analog output (cpout) on node cpout whose voltage level is raised or lowered according to the Up and Dn signals. So as not to obscure the embodiments, the term node and signal on that node are interchangeably used. For example, depending on the context, the term "cpout" may refer to voltage on node cpout, or output signal cpout.

In one embodiment, charge pump 303 receives digital word 103 (e.g., $202_{1-N}$) to control the amount of current sourced or sunk from node cpout. For example, digital word 103 (e.g., $202_{1-N}$) may turn on or off transistors of charge pump 303 which are responsible for increasing and/or decreasing amount of current sourced and/or sunk from node cpout.

In one embodiment, loop filter 304 comprises an RC (resistor capacitor) filter which generates a filtered version Vcnt1 of output cpout. Vcnt1 is received by VCO 305 and is used to adjust delay of VCO cells in VCO 305 to adjust frequency of OutClk. In one embodiment, VCO 305 receives digital word 103 (e.g., $202_{1-N}$) to adjust frequency of OutClk. For example, digital word 103 (e.g., $202_{1-N}$) may turn on or off transistors of VCO cells for increasing and/or decreasing propagation delay through the VCO cells. The output OutClk is divided in frequency by divider 306 to generate FbClk.

In one embodiment, only VCO 305 receives digital word 103 (e.g., $202_{1-N}$) from the supply droop detector 101. In another embodiment, both VCO 305 and charge pump 303 receive digital word 103 (e.g., $202_{1-N}$) from the supply droop detector 101. In other embodiments, other components of PLL 301 may also receive digital word 103 (e.g., $202_{1-N}$) to adjust PLL loop characteristics. In one embodiment, charge pump 303 uses digital word 103 (e.g., $202_{1-N}$) to dynamically manage the phase error accumulation, caused by change in frequency of OutClk by VCO 305, by making the PLL loop under damped or over damped.

In one embodiment, when voltage supply droop detector 101 detects a droop on power supply Vcc, voltage supply droop detector 101 generates digital word 103 which represents the droop characteristics in the form of a thermometer code. In such an embodiment, PLL 301 receives digital word 103 and adjusts the oscillation frequency of VCO 305 proportional to the droop (slows down for under shoot and speeds up for overshoot) such that OutClk maintains its average frequency regardless of the droop. In one embodiment, charge pump 303 also receives digital code 103 and adjusts the PLL system response by making the charge pump 303 stronger (i.e., more transistors are turned on in the charge pump 303 to source and/or sink more current from cpout) or weaker (i.e., more transistors are turned off in the charge pump 303 to source and/or sink less current from cpout) to dynamically manage the phase accumulation error caused by speeding up/slowing down the oscillation frequency of VCO 305.

Figure 4:
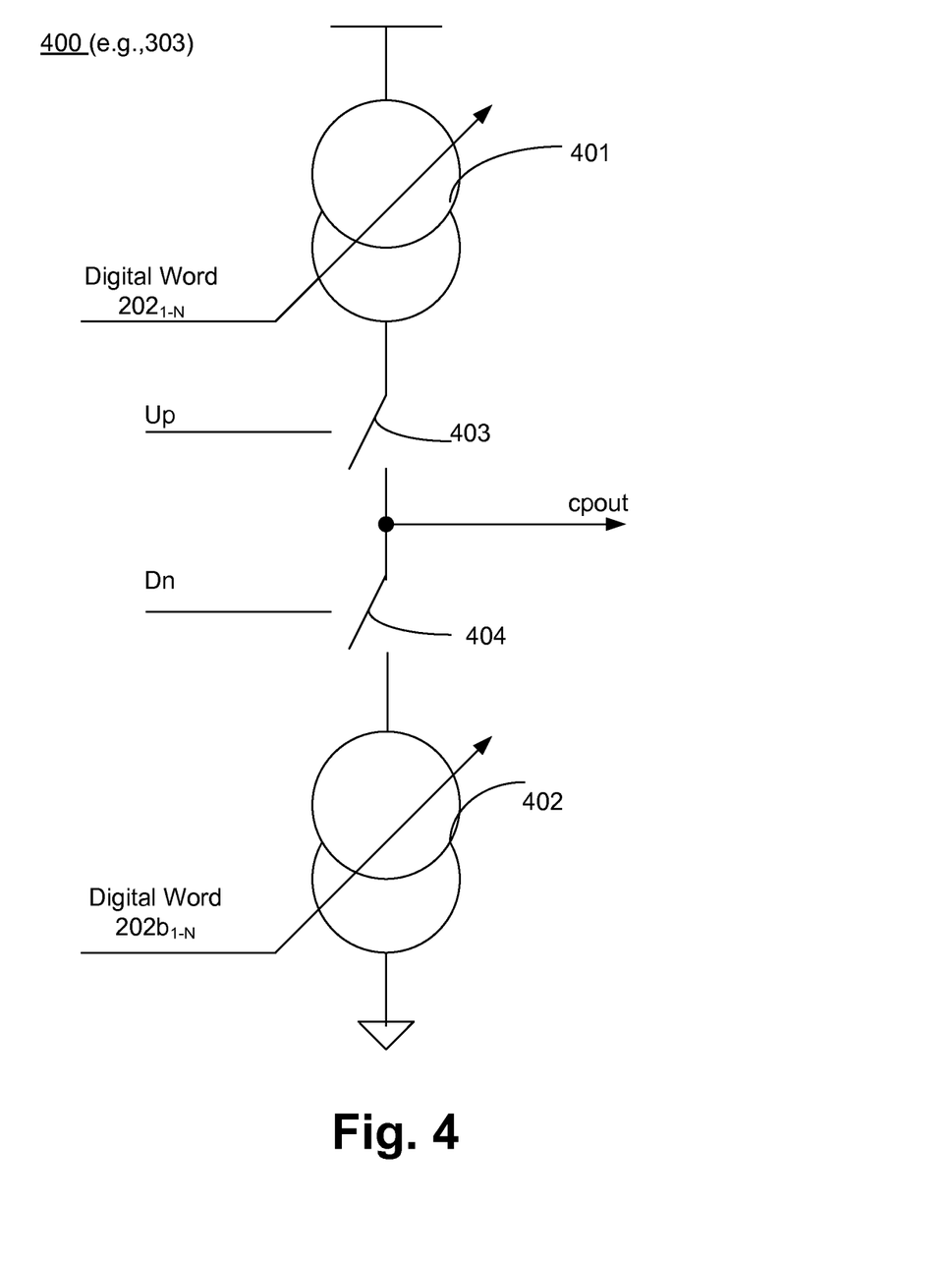
FIG. 4 is a high level architecture of a charge-pump which uses output of the droop detector to adjust PLL loop characteristics, according to one embodiment of the disclosure.

FIG. 4 is a high level architecture of a charge pump 400 (e.g., 303) which uses output of the droop detector to adjust PLL loop characteristics, according to one embodiment of the disclosure. It is pointed out that those elements of FIG. 4 having the same reference numbers (or names) as the elements of any other figure can operate or function in any manner similar to that described, but are not limited to such.

In one embodiment, charge pump 400 comprises a first current source 401, second current source 402, Up switch 403, and Dn switch 404. In one embodiment, first current source 401 sources current on node cpout when Up switch 403 is closed. In one embodiment, first current source 401 comprises transistors coupled in parallel to one another and controllable by digital word $202_{1-N}$. For example, each of the transistors receives one of the bits of digital word $202_{1-N}$ to control the gate terminal of that transistor. In one embodiment, each transistor controllable by digital word $202_{1-N}$ is of the same size.

In one embodiment, second current source 402 sinks current from node cpout when Dn switch 404 is closed. In one embodiment, second current source 402 comprises transistors coupled in parallel to one another and controllable by digital word $202b_{1-N}$, where $202b_{1-N}$ is inverse of $202_{1-N}$. For example, each of the transistors receives one of the bits of digital word $202b_{1-N}$ to control the gate terminal of that transistor. In one embodiment, each transistor controllable by digital word $202b_{1-N}$ is of the same size. In one embodiment, each transistor controllable by digital word $202b_{1-N}$ is of the different size to provide a variable current step.

In one embodiment, in response to voltage droop on Vcc, charge pump 400 under damps the PLL system by making the charge pump 400 stronger (i.e., more transistors are turned on in first current source 401 and second current source 402 to source and/or sink more current from cpout) to dynamically manage the phase accumulation error caused by changing the oscillation frequency of VCO 305. In one embodiment, charge pump 400 over damps the PLL system by making the charge pump 400 weaker (i.e., more transistors are turned off in first current source 401 and second current source 402 to source and/or sink less current from cpout) to dynamically manage the phase accumulation error caused by changing the oscillation frequency of VCO 305.

Figure 5:
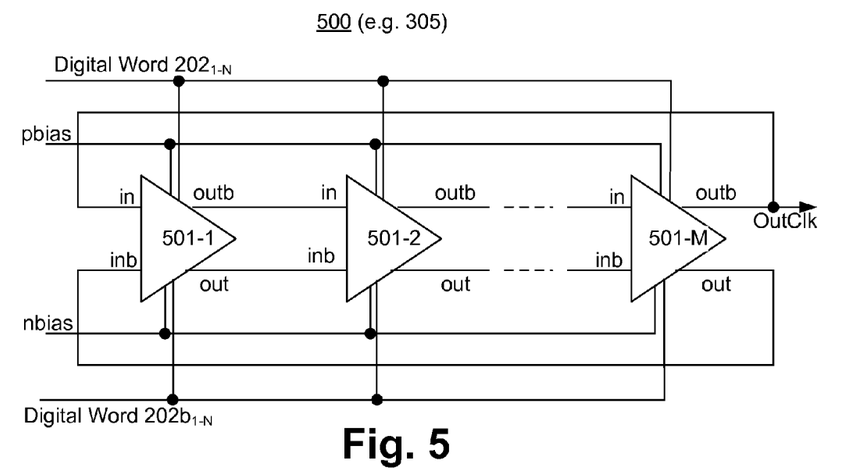
FIG. 5 is a high level circuit of a voltage controlled oscillator (VCO) which uses output of the droop detector to scale frequency of the PLL, according to one embodiment of the disclosure.

FIG. 5 is a high level architecture of voltage controlled oscillator (VCO) 500 (e.g., 305) which uses output of the droop detector to scale frequency of the PLL, according to one embodiment of the disclosure. It is pointed out that those elements of FIG. 5 having the same reference numbers (or names) as the elements of any other figure can operate or function in any manner similar to that described, but are not limited to such.

In one embodiment, VCO 500 comprises a plurality of VCO cells 501-1 through 501-M, where 'M' is an integer greater than two. In one embodiment, each VCO cell (e.g., 501-1) receives a bias voltage (e.g., pbias and/or nbias) to set propagation delay of the VCO cell. In this embodiment, pbias is the same as Vcnt1 of FIG. 3. In one embodiment, nbias is generated by a reference generator (not shown). In one embodiment, each VCO cell is a differential cell (i.e., it receives differential inputs "in" and "inb" and generates differential output "outb" and "out," where "inb" is an inverse of "in," and where "outb" is an inverse of "out.") In one embodiment, "outb" of a VCO cell is received at "in" terminal of the next VCO cell. For example, "outb" of VCO 501-1 is received by "in" terminal of VCO cell 501-2, and "out" of VCO 501-1 is received by "inb" of VCO cell 501-2. The output of last VCO cell 501-1M is fed back as input to the first VCO cell 501-1 forming a ring oscillator. In one embodiment, each VCO cell receives digital word $202_{1-N}$ to adjust resistance of p-type devices coupled to Vcc. In one embodiment, each VCO cell also receives digital word $202b_{1-N}$ to adjust n-type current source strength of each VCO cell.

In one embodiment, when voltage supply droop detector 101 detects a droop (undershoot/overshoot) on power supply Vcc, voltage supply droop detector 101 generates digital word 103 which represents the droop characteristics in the form of a thermometer code. In such an embodiment, digital words $202_{1-N}$ and $202b_{1-N}$ slows down/speeds up the oscillation frequency of VCO 500 such that OutClk maintains its average frequency regardless of the droop undershoot or overshoot.

Figure 6:
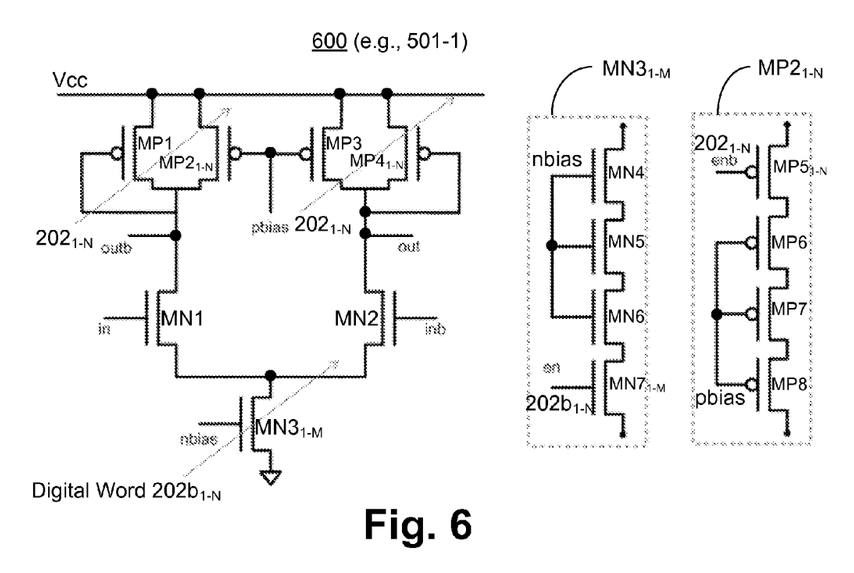
FIG. 6 is a circuit of a VCO cell which uses output of the droop detector to scale delay of the VCO cell, according to one embodiment of the disclosure.

FIG. 6 is a circuit of a VCO cell 600 (e.g., 501-1) which uses output of the droop detector to scale delay of the VCO cell, according to one embodiment of the disclosure. It is pointed out that those elements of FIG. 6 having the same reference numbers (or names) as the elements of any other figure can operate or function in any manner similar to that described, but are not limited to such.

In one embodiment, VCO cell 600 is a differential cell that receives inputs "in" and "inb" by n-type transistors MN1 and MN2 respectively. In one embodiment, VCO cell 600 comprises p-type devices MP1 and $MP2_{1-N}$ which are coupled together in parallel, where MP1 is diode connected and $MP2_{1-N}$ behaves like a resistor with adjustable resistance. In one embodiment, at least one of $MP2_{1-N}$ is operable to be turned on via pbias (same as vcnt1), while the other transistors are controllable by digital word $202_{1-N}$ from supply droop detector 200. In one embodiment, VCO cell 600 comprises p-type devices MP3 and $MP4_{1-N}$ which are coupled together in parallel, where MP3 is diode connected and $MP4_{1-N}$ behaves like a resistor with adjustable resistance. In one embodiment, at least one of $MP3_{1-N}$ is always on via pbias (same as vcnt1), while the other transistors are controllable by digital word $202_{1-N}$ from supply droop detector 200. In one embodiment, drain terminals of MP1 and $MP2_{1-N}$ form "outb" node while drain terminals of MP3 and $MP4_{1-N}$ form "out" nodes, where signal on "outb" is inverse of signal on "out."

In one embodiment, VCO cell 600 comprises an adjustable n-type current source $MN3_{1-M}$, where 'M' is an integer greater than two. In one embodiment, $MN3_{1-M}$ receives analog signal nbias to bias the current source. In one embodiment, digital word $202b_{1-N}$, which is inverse of $202_{1-N}$, is used to adjust strength of current source $MN_{1-M}$. On the right side of FIG. 6, exemplary embodiments of $MN3_{1-M}$ and $MP2_{1-N}$ are shown.

In one embodiment, $MN3_{1-M}$ comprises a plurality of n-type transistors—MN4, MN5, MN6, and $MN7_{1-M}$—coupled together in series. In one embodiment, n-type devices MN4, MN5, and MN6 are biased by nbias. In one embodiment, $MN7_{1-M}$ is controlled by $202b_{1-N}$. While the embodiment of $MN3_{1-M}$ illustrates three series coupled transistors biased by nbias, any number of series coupled transistors may be used. The position of $MN7_{1-M}$ may also be adjusted along the stack of transistors. For example, $MN7_{1-M}$ may be at the top of the stack coupled to MN1 and MN2 instead at the bottom of the stack as shown.

In one embodiment, $MP2_{1-N}$ comprises a plurality of p-type transistors—$MP5_{1-N}$, MP6, MP7, and MP8—coupled together in series. In one embodiment, p-type devices MP6, MP7, and MP8 are biased by pbias (same as Vcnt1). In one embodiment, $MP5_{1-N}$ is controlled by $202_{1-N}$. While the embodiment of $MP2_{1-N}$ illustrates three series coupled transistors biased by pbias, any number of series coupled transistors may be used. The position of $MP5_{1-N}$ may also be adjusted along the stack of transistors. For example, $MP5_{1-N}$ may be at the bottom of the stack coupled to MN1 and MN2 instead at the top of the stack as shown.

FIG. 7A is a circuit 700 with the droop detector to adaptively scale frequency output of a digital PLL (DPLL), according to one embodiment of the disclosure. It is pointed out that those elements of FIG. 7A having the same reference numbers (or names) as the elements of any other figure can operate or function in any manner similar to that described, but are not limited to such.

In one embodiment, DPLL 701 (e.g., 102) comprises a phase frequency detector (PFD) 702, digital controller 703, digital filter 704, digitally controlled oscillator (DCO) 705, and divider 706. So as not to obscure the embodiments, all components of DPLL 701 are not shown. In one embodiment, PFD 702 receives RefClk and feedback clock (FbClk) from divider 706 and generates Up and Down ("Dn") signals indicating whether FbClk is ahead or behind RefClk in terms of phase and frequency. In one embodiment, Up and Dn signals are received by digital controller 703 which generates a control word for digital filter 704. In one embodiment, digital controller 703 is a finite state machine. In one embodiment, digital filter 704 filters digital noise in the control word and generates a filtered code for DCO 705.

In one embodiment, digital filter 704 also receives digital word $202_{1-N}$ (same as 103) from supply droop detector 101. In one embodiment, digital word $202_{1-N}$ is used to adjust filter coefficients to change the characteristics of the DPLL loop. For example, digital word $202_{1-N}$ is used to make the DPLL system over damped or under damped to dynamically manage the accumulated phase error.

Figure 7B:
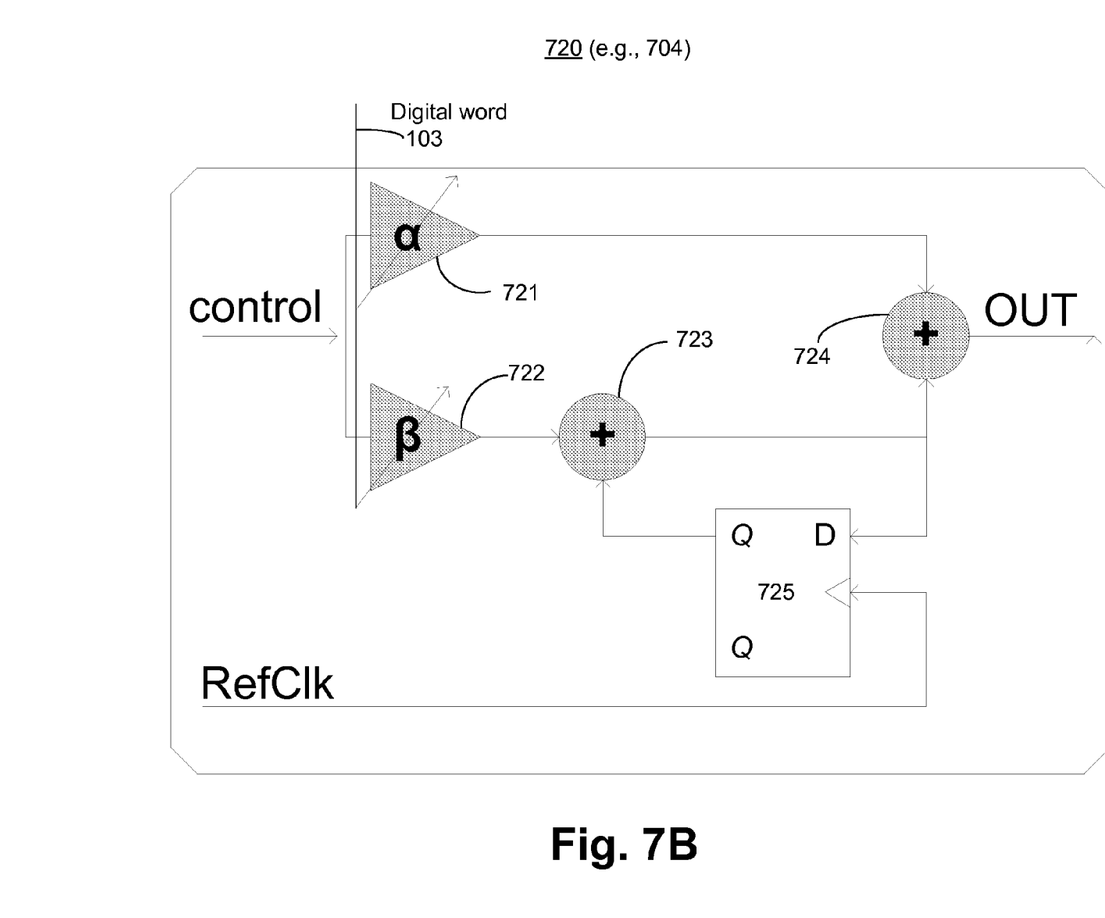
FIG. 7B is a digital filter 720 (e.g., 704) with the droop detector to dynamically manage the phase error accumulation, caused by change in frequency of the DPLL 700, according to one embodiment of the disclosure.

FIG. 7B is a digital filter 720 (e.g., 704) with the droop detector to dynamically manage the phase error accumulation, caused by change in frequency output of the DPLL 700, according to one embodiment of the disclosure. It is pointed out that those elements of FIG. 7B having the same reference numbers (or names) as the elements of any other figure can operate or function in any manner similar to that described, but are not limited to such.

In one embodiment, digital filter 720 comprises a first stage 721 defined by α which is a proportional coefficient, a second stage 722 defined by β which is an integral coefficient, first adder 723, second adder 724, and sequential unit 725. In one embodiment, both α and β are programmable. In one embodiment, first stage 721 and second stage 722 receive control signal from digital controller 703. In this embodiment, first stage 721 and second stage 722 also receive digital word 103 which is used to program α and β of first (721) and second (722) stages respectively.

In one embodiment, transfer function of digital filter 720 is expressed as:

$$\alpha + [\beta/(1-z^{-1})]$$

In one embodiment, output of first stage 721 is added together by first adder 723 with the output of second adder 724 to generate signal OUT (same as signal Code in FIG. 7A). In one embodiment, second adder 724 adds output of second stage 722 to a previous value of output of second adder 724. In one embodiment, every RefClk cycle, output of second adder 724 is latched by sequential unit 725 (e.g., flip-flop) to generate previous value of output of second adder 724. In one embodiment, when supply loop detector 101 detects a droop in Vcc, digital filter 703 adjusts the loop bandwidth of DPLL 701 by changing the values of α and β coefficients according to the digital word 103.

Referring back to FIG. 7A, in one embodiment, DCO 705 receives digital word 103 (e.g., $202_{1-N}$) to adjust frequency of OutClk. For example, digital word 103 (e.g., $202_{1-N}$) may turn on or off transistors of DCO cells for increasing and/or decreasing propagation delay through the DCO cells. The output OutClk is divided in frequency by divider 706 to generate FbClk. In one embodiment, only DCO 705 receives digital word 103 (e.g., $202_{1-N}$) from supply droop detector 101. In another embodiment, both DCO 705 and digital filter 704 receive digital word 103 (e.g., $202_{1-N}$) from the supply droop detector 101. In other embodiments, other components of DPLL 701 may also receive digital word 103 (e.g., $202_{1-N}$) to adjust DPLL loop characteristics.

In one embodiment, when voltage supply droop detector 101 detects a droop (over shoot/under shoot) on power supply Vcc, voltage supply droop detector 101 generates digital word 103 which represents the droop characteristics in the form of a thermometer code. In such an embodiment, DPLL 701 receives digital word 103 and speeds up the oscillation frequency of DCO 705 in case of the overshoot and then slows it down as the overshoot starts returning to the nominal voltage such that OutClk maintains its average frequency regardless of the droop event. In case of the undershoot, the DPLL 701 receives digital word 103 and slows down the oscillation frequency of DCO 705 and then speeds it up as the undershoot starts returning to the nominal voltage such that OutClk maintains its average frequency regardless of the droop event.

Figure 8:
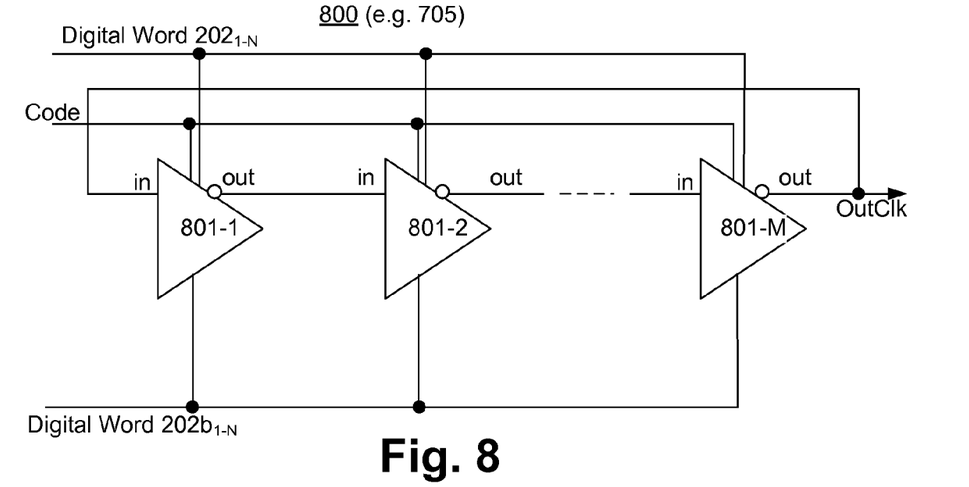
FIG. 8 is a high level circuit of a digitally controlled oscillator (DCO) which uses output of the droop detector to scale frequency of the DPLL, according to one embodiment of the disclosure.

FIG. 8 is a high level circuit of a DCO 800 (e.g., 705) which uses output of the droop detector to scale frequency of the PLL, according to one embodiment of the disclosure. It is pointed out that those elements of FIG. 8 having the same reference numbers (or names) as the elements of any other figure can operate or function in any manner similar to that described, but are not limited to such.

In one embodiment, DCO 800 comprises a plurality of DCO cells 801-1 through 801-M coupled together to form a ring oscillator, where 'M' is an integer greater than two. In one embodiment, each of the DCO cells is an inverting cell such that its output "out" is an inverse of its input "in." Output of the last DCO cell 801-M is coupled to the input of first DCO cell 801-1. In one embodiment, each DCO cell receives a bit of digital word $202_{1-N}$ to adjust delay of that DCO cell. In one embodiment, each DCO cell also receives multiple bits of digital word $202b_{1-N}$ to adjust delay of that DCO cell, where digital word $202b_{1-N}$ is inverse of digital word $202_{1-N}$.

Figure 9:
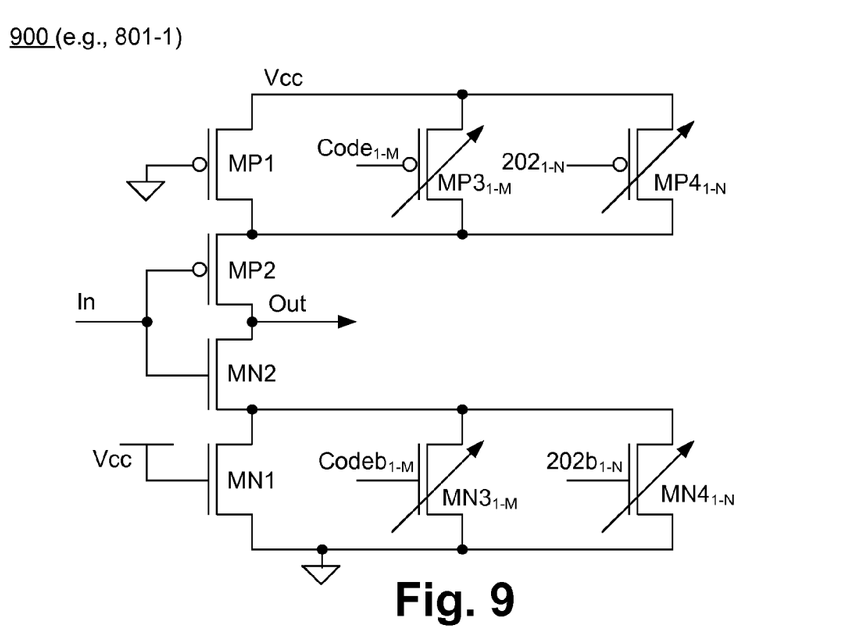
FIG. 9 is a circuit of a DCO cell which uses output of the droop detector to scale delay of the DCO cell, according to one embodiment of the disclosure.

FIG. 9 is a circuit of a DCO cell 900 (e.g., 801-1) which uses output of the droop detector to scale delay of the DCO cell, according to one embodiment of the disclosure. It is pointed out that those elements of FIG. 9 having the same reference numbers (or names) as the elements of any other figure can operate or function in any manner similar to that described, but are not limited to such.

In one embodiment, DCO cell 900 comprises p-type transistor MP1 which is operable to be turned on. In one embodiment, MP1 is coupled in parallel to a plurality of p-type transistors $MP3_{1-M}$, which are controllable by $Code_{1-M}$ from digital filter 704, where 'M' is an integer. In one embodiment, MP1 is also coupled in parallel to a plurality of p-type transistors $MP4_{1-N}$ which are controllable by digital word $202_{1-N}$ from supply droop detector 101.

In one embodiment, DCO cell 900 comprises an inverter having transistors MP2 and MN2 which receive input "In" and generate output "Out," where "Out" is an inverse of "In." In one embodiment, MP2 is coupled to MP1. In one embodiment, MN2 is coupled to MN1 which is operable to be turned on. In one embodiment, MN1 is coupled in parallel to a plurality of n-type transistors $MN3_{1-M}$ which are controllable by $Codeb_{1-M}$ from digital filter 704, where $Codeb_{1-M}$ is an inverse of $Code_{1-M}$. In one embodiment, MN1 is also coupled in parallel to a plurality of n-type transistors $MN4_{1-N}$ which are controllable by digital word $202b_{1-N}$ from supply droop detector 101.

Figure 10:
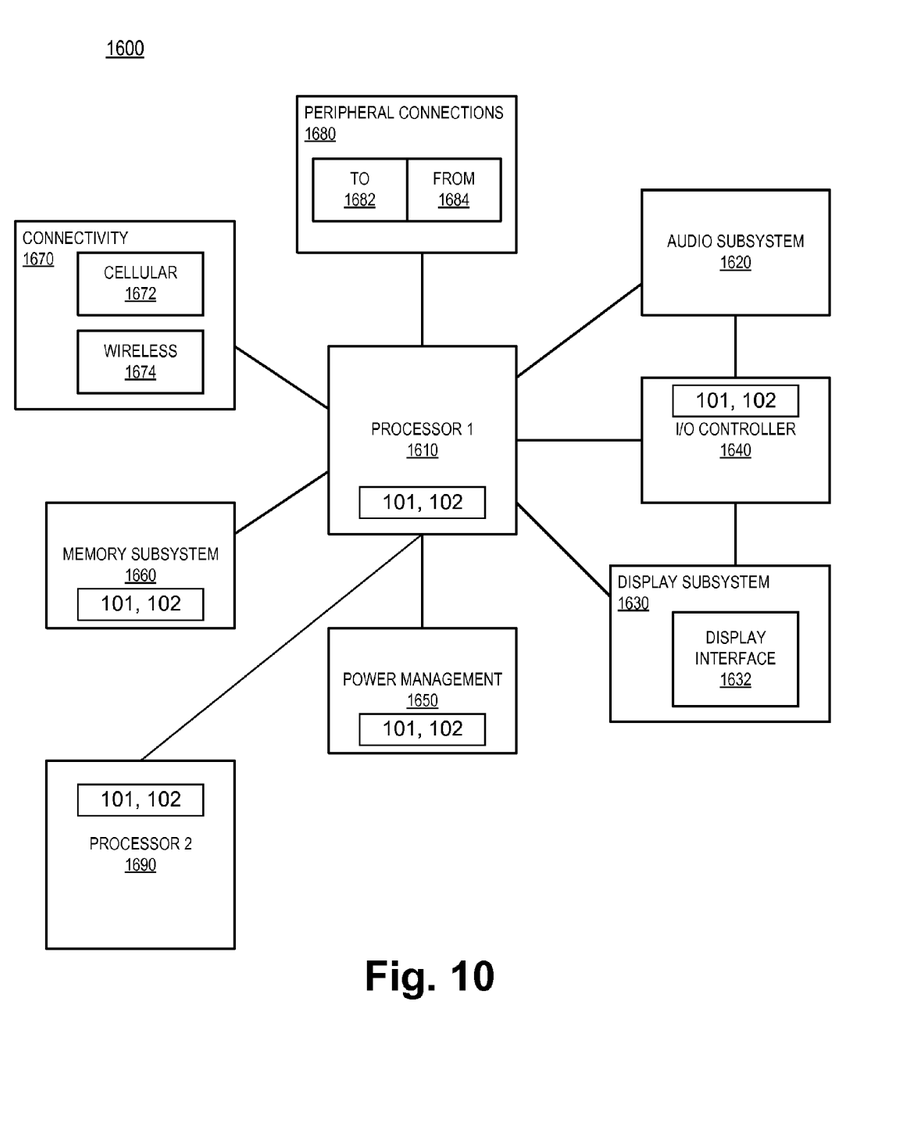
FIG. 10 is a smart device or a computer system or an SOC (system on chip) with a droop detector to scale frequency of a signal generated by a clock generator, according to one embodiment of the disclosure.

FIG. 10 is a smart device or a computer system or an SOC (system on chip) with digital adaptive droop detector to scale frequency of a clock generator in case of a droop or overshoot on power supply, according to one embodiment of the disclosure. It is pointed out that those elements of FIG. 10 having the same reference numbers (or names) as the elements of any other figure can operate or function in any manner similar to that described, but are not limited to such.

FIG. 10 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 with supply droop detector 101 and clock generator 102, according to the embodiments discussed. Other blocks of the computing device 1600 may also include supply droop detector 101 and clock generator 102. The various embodiments of the present disclosure may also comprise a network interface within 1670 such as a wireless interface so that a system embodiment may be incorporated into a wireless device, for example, cell phone or personal digital assistant.

In one embodiment, processor 1610 (and processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment, an integrated circuit (IC) comprises: a voltage droop detector coupled to power supply node, the voltage droop detector to generate a digital code word representing voltage droop on the power supply node; and a PLL including a ring oscillator coupled to the power supply node, the ring oscillator to generate an output clock signal, the ring oscillator operable to adjust frequency of the output clock signal according to the digital code word.

In one embodiment, the PLL comprises a charge pump which is operable to receive the digital code word. In one embodiment, the charge pump comprises a plurality of transistors some of which are controllable by the digital code word to adjust current strength of the output of the charge pump. In one embodiment, the PLL comprises a digital filter which is operable to receive the digital code word. In one embodiment, the digital filter is characterized by coefficients some of which are adjusted by the digital code word. In one embodiment, the ring oscillator is VCO. In one embodiment, the VCO comprises a plurality of delay cells each of which includes a transistor which receives the digital code word. In one embodiment, the ring oscillator is a DCO. In one embodiment, DCO comprises a plurality of delay cells each of which includes a transistor which receives the digital code word. In one embodiment, the voltage droop detector comprises an Analog to Digital Converter (ADC).

In another example, in one embodiment, an apparatus comprises: a power supply node; a droop detector coupled to the power supply node, the droop detector to generate digital output representing voltage of the power supply node; and a PLL coupled to the droop detector and the power supply node, the PLL to adjust its characteristics according to the digital output from the droop detector. In one embodiment, the PLL is at least one of: Self-biased PLL; Digital PLL; or LC PLL.

In one embodiment, the PLL comprises a ring oscillator coupled to the power supply node, the ring oscillator to receive the digital output. In one embodiment, the PLL comprises a charge pump coupled to the power supply node, the charge pump to receive the digital output. In one embodiment, the PLL comprises a digital filter which receives the digital output.

In another example, in one embodiment, a system comprises: a memory; a processor coupled to the memory, the processor comprising: a voltage droop detector coupled to power supply node, the voltage droop detector to generate a digital code word representing voltage droop on the power supply node; and a PLL including a ring oscillator coupled to the power supply node, the ring oscillator to generate an output clock signal, the ring oscillator operable to adjust frequency of the output clock signal according to the digital code word; a wireless interface for allowing the processor to communicate with other devices; and a display unit.

In one embodiment, the processor is a multi-core processor having multiple processing cores, and wherein each processor core includes voltage droop detector. In one embodiment, the PLL comprises a charge pump which is operable to receive the digital code word. In one embodiment, the PLL comprises a digital filter which is operable to receive the digital code word. In one embodiment, the voltage droop detector comprises an ADC.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An integrated circuit (IC) comprising:
    a voltage droop detector coupled to a power supply node, the voltage droop detector to generate a digital code word having at least two bits representing characteristics of voltage droop on the power supply node; and
    a phase locked loop (PLL) including:
        a ring oscillator coupled to the power supply node, the ring oscillator to generate an output clock signal, the ring oscillator to receive the digital code word, and wherein the ring oscillator is operable to adjust a frequency of the output clock signal according to the digital code word; and
        a filter to receive the digital code word which is to adjust an output of the filter according to the digital code word, and wherein the output of the filter is received by the ring oscillator.

2. The IC of claim 1, wherein the PLL comprises a charge pump which is operable to receive the digital code word.

3. The IC of claim 2, wherein the charge pump comprises a plurality of transistors at least one of which is controllable by the digital code word to adjust current strength of the output of the charge pump.

4. The IC of claim 1, wherein the filter is a digital filter.

5. The IC of claim 1, wherein the filter is characterized by coefficients some of which are adjusted by the digital code word.

6. The IC of claim 1, wherein the ring oscillator is a voltage controlled oscillator (VCO).

7. The IC of claim 6, wherein the VCO comprises a plurality of delay cells at least one of which includes a transistor which receives at least one bit of the digital code word.

8. The IC of claim 1, wherein the ring oscillator is a digitally controlled oscillator (DCO).

9. The IC of claim 8, wherein the DCO comprises a plurality of delay cells at least one of which includes a transistor which receives at least one bit of the digital code word.

10. The IC of claim 1, wherein the voltage droop detector comprises an Analog to Digital Converter (ADC).

11. A system comprising:
    a memory;
    a processor coupled to the memory, the processor comprising:
        a voltage droop detector coupled to power supply node, the voltage droop detector to generate a digital code word having at least two bits representing characteristics of voltage droop on the power supply node; and
        a phase locked loop (PLL) including:
            a ring oscillator coupled to the power supply node, the ring oscillator to generate an output clock signal, the ring oscillator to receive the digital code word, and wherein the ring oscillator is operable to adjust frequency of the output clock signal according to the digital code word; and
            a filter to receive the digital code word, wherein the filter is to adjust its output according to the digital code word, and wherein the output of the filter is received by the ring oscillator;
    a wireless interface to allow the processor to communicate with other devices; and
    a display interface to allow a display unit to display content processed by the processor.

12. The system of claim 11, wherein the processor is a multi-core processor having multiple processing cores, and wherein at least one processor core of the multiple processing cores includes a voltage droop detector.

13. The system of claim 11,
    wherein a number of active bits in the digital output code word is proportional to droop quantization associated with the voltage droop on the power supply node.

14. The system of claim 13, wherein the filter is a digital filter, and wherein the digital filter is to receive the digital output code word and to adjust coefficients of the digital filter according to the digital output code word.

15. The system of claim 13, wherein the PLL comprises a charge pump to receive the digital output code word to adjust a voltage level of a control voltage signal which is received by the ring oscillator.

16. The system of claim 13, wherein the digital code word is a thermometer code which is a monotonic representation of any droop or overshoot on the power supply node.

17. The system of claim 16, wherein the digital code word has a nominal value to which the active bits are appended upon an overshoot on the power supply node.

18. The system of claim 17, wherein the active bits are deactivated as the overshoot on the power supply node decreases.

* * * * *